United States Patent
Han et al.

(10) Patent No.: US 8,808,565 B2
(45) Date of Patent: Aug. 19, 2014

(54) NANOPARTICLE HAVING IMIDAZOLIUM SALT CHEMICALLY BOUND THERETO, METHOD OF PREPARING THE SAME, AND NANOGEL ELECTROLYTE FOR DYE-SENSITIVE SOLAR CELL COMPRISING THE SAME

(75) Inventors: Chi-Hwan Han, Seongnam-si (KR); Tae-Yeon Cho, Chungcheongnam-do (KR); Sang-Hoon Bae, Busan (KR); Kwan-Woo Ko, Daejeon (KR); Jae-Hyung Bak, Daejeon (KR)

(73) Assignee: Korea Institute of Energy Research, Daejeon (KR)

( * ) Notice: Subject to any disclaimer, the term of this patent is extended or adjusted under 35 U.S.C. 154(b) by 138 days.

(21) Appl. No.: 13/553,125

(22) Filed: Jul. 19, 2012

(65) Prior Publication Data

US 2013/0020523 A1    Jan. 24, 2013

(30) Foreign Application Priority Data

Jul. 21, 2011    (KR) .................. 10-2011-0072265

(51) Int. Cl.
| | | |
|---|---|---|
| *H01L 31/042* | (2014.01) | |
| *H01G 9/20* | (2006.01) | |
| *C09C 1/36* | (2006.01) | |
| *C01B 33/18* | (2006.01) | |
| *B82Y 30/00* | (2011.01) | |
| *C09C 1/30* | (2006.01) | |
| *H01L 51/00* | (2006.01) | |
| *B82Y 40/00* | (2011.01) | |

(52) U.S. Cl.
CPC ............ *C09C 1/3063* (2013.01); *H01G 9/2013* (2013.01); *H01G 9/2059* (2013.01); *H01L 51/0094* (2013.01); *B82Y 40/00* (2013.01); *H01G 9/2031* (2013.01); *C09C 1/3669* (2013.01); *C01B 33/18* (2013.01); *B82Y 30/00* (2013.01); *Y02E 10/542* (2013.01); *Y02E 10/52* (2013.01)
USPC ......................................... 252/62.2; 136/263

(58) Field of Classification Search
USPC ......................................... 252/62.2; 136/263
See application file for complete search history.

(56) References Cited

U.S. PATENT DOCUMENTS

| | | | |
|---|---|---|---|
| 4,927,721 A | 5/1990 | Gratzel et al. | ................ 429/111 |
| 6,384,321 B1 | 5/2002 | Mikoshiba et al. | |
| 7,884,218 B2 | 2/2011 | Shin et al. | |

FOREIGN PATENT DOCUMENTS

| | | |
|---|---|---|
| KR | 1020010030478 A | 4/2001 |
| KR | 1020010030478 A | 4/2001 |
| KR | 1020090076409 A | 7/2009 |
| KR | 1020100058996 A | 6/2010 |

OTHER PUBLICATIONS

Peng Wang et al., "Solidifying liquid electrolytes with fluorine polymer and silica nanoparticles for quasi-solid dye-sensitized solar cells", Journal of Flourine Chemistry, Aug. 2004, vol. 125, pp. 1241-1245.

*Primary Examiner* — Carol M Koslow
(74) *Attorney, Agent, or Firm* — Brian R. Morrison; Westman, Champlin & Koehler, P.A.

(57) ABSTRACT

A nanoparticle to which an imidazolium salt is chemically bonded, a method of preparing the same, and a nanogel electrolyte for dye-sensitized solar cells comprising the same are disclosed. The present invention may provide a dye-sensitive solar cell with good economic feasibility, stability and photoelectric conversion efficiency using the nanogel electrolyte, wherein the nanogel electrolyte may reduce the concentration of ionic liquids and preparation costs while improving economic feasibility, long term stability, and photoelectric conversion efficiency.

6 Claims, No Drawings

NANOPARTICLE HAVING IMIDAZOLIUM SALT CHEMICALLY BOUND THERETO, METHOD OF PREPARING THE SAME, AND NANOGEL ELECTROLYTE FOR DYE-SENSITIVE SOLAR CELL COMPRISING THE SAME

CROSS-REFERENCE TO RELATED APPLICATION

This application claims the benefit of Korean Patent Application No. 10-2011-0072265, filed on Jul. 21, 2011 in the Korean Intellectual Property Office, the disclosures of which are incorporated herein by reference.

BACKGROUND

1. Technical Field

The present invention relates to a nanogel electrolyte for dye-sensitive solar cells including nanoparticles, and more particularly, to a nanoparticle containing an imidazolium salt chemically bonded thereto, a method of preparing the same, and a nanogel electrolyte for dye-sensitive solar cells including the same.

2. Description of the Related Art

Recently, the development of next generation clean energy has become a major issue due to severe environmental pollution and depletion of fossil fuels. Particularly, it is expected that a solar cell, that is, a device capable of converting sunlight directly into electrical energy, will become an energy source capable of solving future energy problems as they generate little air pollution, their resources are inexhaustible and they have semi-permanent life. Such solar cells are broadly classified into three main types, i.e., inorganic solar cells, dye-sensitive solar cells and organic solar cells, depending on the materials used. In inorganic solar cells, single crystal silicon is mainly used. Such singe crystal silicon solar cells have a merit of being fabricated as thin film type solar cells. However, there are problems in that they are too expensive and have low stability.

A dye-sensitive solar cell developed by Gratzel et al. (Switzerland) in 1991 is a photoelectrochemical solar cell based on an oxide semiconductor electrode comprising nanocrystalline titanium oxide particles, which transport both photosensitive dye molecules capable of generating electron-hole pairs by absorbing visible light and the generated electrons. This dye-sensitive solar cell is also called a "wet etched solar cell". This solar cell provides various merits such as a simple manufacturing process, low manufacturing costs, and practical photoelectric conversion efficiency above silicon solar cells, thereby promoting many studies on the development of such a solar cell.

Generally, the dye-sensitive solar cell has a problem with low stability of cell to modules clue to use of a liquid electrolyte. Particularly, the liquid electrolyte has difficulty in sealing and is likely to be volatilized and leaked upon increase in external temperature, thereby causing lack of electrochemical stability over a long period of time.

To solve these problems, inorganic solid electrolytes and polymer solid electrolytes have been developed in recent years. However, the use of such solid electrolytes results in poor transfer properties at an interface between electrons and ions, thereby causing noticeable decrease in photoelectric conversion efficiency, as compared with the liquid electrolyte. Further, in order to improve photoelectric conversion efficiency of non-liquid electrolytes, intensive studies have been carried out to develop dye-sensitive solar cells in a "quasi-solid state" or a "solid-state" by preparing a gel electrolyte using ionic liquids. As reported in "Journal of Fluorine Chemistry Volume 125 (August 2004), pp. 1241-1245", a gel electrolyte is prepared by mixing a nano silica material and a liquid electrolyte. This gel electrolyte prepared by mixing the nano silica material and the liquid electrolyte has low affinity between the nano silica and the liquid electrolyte, causing the liquid electrolyte to be easily volatized at high temperatures. Further, the gel electrolyte still contains a solvent, which entails a limit in enhancement of long term stability.

The inventors of the present invention have intensively investigated to solve the aforementioned problems and found that the use of a nanogel electrolyte prepared by mixing an ionic liquid electrolyte and a nanoparticle containing an imidazolium salt chemically bound thereto can improve both long term stability and photoelectric conversion efficiency of a dye-sensitive solar cell.

BRIEF SUMMARY

The present invention has been conceived to solve the problems of the related art, and an object of the present invention is to provide a nanogel electrolyte for dye-sensitive solar cells, which may improve long term stability of dye-sensitive solar cells using liquid electrolytes while enhancing photoelectric conversion efficiency above conventional dye-sensitive solar cells using liquid electrolytes, a method of preparing the same, and a nanogel electrolyte for dye-sensitive solar cells using the same.

In accordance with an aspect of the present invention, there is provided a nanogel electrolyte for dye-sensitive solar cells comprising: a nanoparticle to which an imidazolium salt represented by the formula 1 is chemically bound; and an ionic liquid electrolyte.

Formula 1

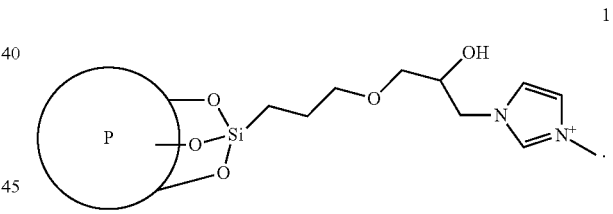

wherein P is a nanoparticle.

The nanoparticle may comprise nano silica ($SiO_2$), nano titanium dioxide ($TiO_2$), or nano tin dioxide ($SnO_2$). More preferably, the nanoparticle is nano silica.

The ionic liquid electrolyte may include an ionic liquid and an oxidation-reduction derivative.

The ionic liquid may help a redox pair in the electrolyte for dye-sensitive solar cells migrate better. Although any ionic liquid known in the art may be used, the ionic liquid may be prepared by mixing at least one selected from the group consisting of n-methylimidazolium iodide, n-ethylimidazolium iodide, ethyl-methyl imidazolium iodide, 1-benzyl-2-methyl imidazolium iodide, 1-ethyl-3-methyl imidazolium iodide, 1-butyl-3-methylimidazolium iodide, methylpyridinium iodide, ethylpyridinium iodide, propylpyridinium iodide, methylethylpyridinium iodide, dimethylpyridinium iodide, ethylmethylimidazolium dicyanamide, and guanidium thiocyanate.

Although any oxidation-reduction derivative known in the art may be used, the oxidation-reduction derivative may be selected from among lithium iodide, sodium iodide, potassium iodide, lithium bromide, sodium bromide, potassium bromide, a quaternary ammonium salt, an imidazolium salt, a pyridinium salt, etc.

Typical ionic liquids have low purity and are expensive, causing increase in manufacturing cost. On the contrary, according to the present invention, a nanoparticle to which an imidazolium salt represented by Formula 1 is chemically bound is provided to a nanogel electrolyte to allow the imidazolium salt to provide some functions of ionic liquids, such that the concentration of ionic liquids to be used is lowered, thereby reducing preparation cost for the electrolyte.

A method of manufacturing a dye-sensitive solar cell including an anode, a cathode, and an electrolyte layer is widely known in the art, and a detailed description thereof will be omitted herein. Here, the nanogel electrolyte for dye-sensitive solar cells according to the present invention may be coated on an upper side of the anode to form an electrolyte layer by printing such as screen printing.

In accordance with another aspect of the present invention, there is provided a nanoparticle to which an imidazolium salt represented by the formula 1 is chemically bound.

Formula 1

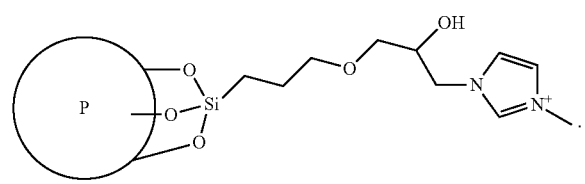

wherein P is a nanoparticle.

The nanoparticle may be in a solid state, be purified by simple washing, and may easily be prepared. The nanoparticle may comprise nano silica ($SiO_2$), nano titanium dioxide ($TiO_2$), or nano tin dioxide ($SnO_2$). More preferably, the nanoparticle is nano silica.

In accordance with another aspect of the present invention, there is provided a method of preparing a nanoparticle, to which an imidazolium salt represented by Formula 1 is chemically bound, which includes: (S1) reacting a nanoparticle with 3-(trimethoxysilyl)propyl methacrylate to prepare a nanoparticle having a surface modified by 3-glycidyloxypropyl trimethoxysilane; (S2) reacting the surface-modified nanoparticle with imidazole; and (S3) reacting the resultant compound with methyl iodide.

<Formula 1>

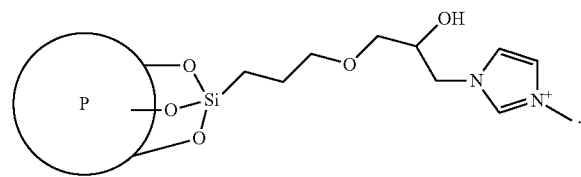

wherein P is a nanoparticle.

In step (S1), a nanoparticle is reacted with 3-(trimethoxysilyl)propyl methacrylate to prepare a nanoparticle having a surface modified by 3-glycidyloxypropyl trimethoxysilane.

In one embodiment, the step of reacting a nanoparticle with 3-(trimethoxysilyl)propyl methacrylate may include dispersing the nanoparticle in an organic solvent, adding 3-(trimethoxysilyl)propyl methacrylate to the resultant solution, and refluxing the solution with stirring at room temperature. After reaction, the resultant is washed to obtain a nanoparticle gel which is subjected to surface modification by 3-glycidyloxypropyl trimethoxysilane. In this step, the nanoparticle may be prepared directly by any known methods or may be commercially obtained. Furthermore, any organic solvent capable of dispersing the nanoparticle may be used. Preferably, the organic solvent is an aromatic hydrocarbon organic solvent, more preferably toluene.

Subsequently, in step (S2), the surface modified nanoparticle is reacted with imidazole. In this step, a nanoparticle to which imidazole represented by Formula 2 is bound is formed:

Formula 2

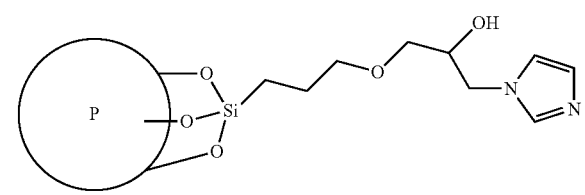

wherein P is a nanoparticle.

In some embodiments, the step (S2) of reacting the surface-modified nanoparticle with imidazole may include dispersing the surface modified nanoparticle in an organic solvent and adding imidazole to the resultant solution. Examples of the organic solvent include alcohol solvents such as ethanol, methanol, propanol, isopropanol, etc., without being limited thereto.

Then, the resulting compound is reacted with methyl iodide to form a nanoparticle to which an imidazolium salt represented by the formula 1 is chemically bound. In this step, a methyl group is introduced into the imidazole bound to nano silica, so that the imidazole is positively charged and forms an imidazolium salt together with an iodide anion. The imidazolium salt formed may provide some functions of ionic liquids.

In some embodiments, the step (S3) of reacting the resultant compound with methyl iodide may include dispersing the resultant compound in an organic solvent and mixing methyl iodide therewith under reflux under reflux. Examples of the organic solvent include alcohol solvents such as ethanol, methanol, propanol, isopropanol, etc., without being limited thereto.

According to the present invention, the imidazolium salt chemically bound to the nanoparticle performs some functions of ionic liquids, thereby reducing the concentration of the ionic liquids in the electrolyte for dye-sensitive solar cells. As a result, it is possible to reduce production cost while improving efficiency of the dye-sensitive solar cells.

Furthermore, the nanogel electrolyte for dye-sensitive solar cells according to the present invention is suited to mass production since it improves long term stability and may form an electrolyte layer by printing.

DETAILED DESCRIPTION

The present invention will be illustrated in more detail with reference to some examples. However, it should be understood that the following examples are provided for illustration only, and that various modifications, variations, and alterations can be made without departing from the spirit and scope of the invention. Therefore, the scope of the invention should be limited only by the accompanying claims and equivalents thereof.

Preparation of Nanoparticle to which Imidazolium Salt is Chemically Bound

Example 1

2.5 g of nano silica (AEROSIL 200, manufactured by Evonik in Germany, 12 nm) was dispersed in toluene to prepare a solution, and then 9.8 ml of 3-(trimethoxysilyl) propyl methacrylate was added to the solution. After stirring for about 1 hour at room temperature, the resulting solution was refluxed for 8 hours. Then, the resulting solution was cooled to room temperature, filtered through filter paper and washed with methanol twice or more to synthesize nano silica having a surface modified by 3-glycidyloxypropyl trimethoxysilane. 13.5 g of the surface modified nano silica was dispersed in 50 ml of methanol. To this solution, 0.3128 g of imidazole was added and was stirred for 48 hours at room temperature. After stirring, the resultant was filtered through filter paper, washed with to methanol three times or more to obtain a nano silica particle to which imidazol is bound. 13.813 g of the synthesized material was dispersed in 50 ml of methanol. To this solution, 0.653 g of methyl iodide ($CH_3I$) was mixed and then refluxed for 12 hours to synthesize a nano silica particle to which an imidazolium salt is chemically bound.

Preparation of Electrolyte for Dye-Sensitive Solar Cells

Example 2

An electrolyte for dye-sensitive solar cells was prepared by mixing 0.6 g of the material synthesized in Example 1 and 1 g of an electrolytic solution (3-methoxypropionitrile+LiI (0.1 M)+$I_2$ (0.05 M)+1-butyl-3-methylimidazolium iodide (0.6 M)+t-butyl pyridine (0.5)).

Comparative Example 1

A nanogel electrolyte for dye-sensitive solar cells was prepared by mixing 0.1 g of nano silica (AEROSIL 200, manufactured by Evonik in Germany, 12 nm) and 1 g of an electrolytic solution (3-methoxypropionitrile+LiI (0.1M)+$I_2$ (0.05 M)+1-butyl-3-methylimidazolium iodide (0.6 M)+t-butyl pyridine (0.5)).

Comparative Example 2

A liquid electrolyte for dye-sensitive solar cells was prepared by mixing only 1 g of an electrolytic solution (3-methoxypropionitrile+LiI (0.1 M)+$I_2$ (0.05 M)+1-butyl-3-methylimidazolium iodide (0.6 M)+t-butyl pyridine (0.5)).

Preparation of Dye-Sensitive Solar Cell (1) A transparent glass substrate having a fluorine-doped transparent conductive tin oxide layer was prepared. A coating composition comprising titanium dioxide was deposited on an upper surface of the transparent conductive oxide layer of the substrate by a doctor blade method and subjected to heat treatment at 500° C. for 30 minutes to form a nano-scale oxide layer having a thickness of about 8 μm through contact and filling between the metal oxide nanoparticles. Then, a coating composition comprising titanium dioxide was deposited on the nano oxide layer in the same manner as above and then heated treated at 500° C. for 30 minutes to form a nano oxide layer having a thickness of about 15 μm. 0.2 nM of ruthenium dithiocyanate 2,2'-bipyridyl-4,4'-dicarboxylate dye solution was prepared. The substrate having the nano oxide layer was immersed in the dye solution for 24 hours and then dried to adsorb the dye into the nano-scale metal oxide to prepare a negative electrode.

(2) A transparent glass substrate having a fluorine-doped transparent conductive tin oxide layer was prepared. A 2-propanol solution containing hydrogen hexachloroplatinate ($H_2PtCl_6$) was dropped onto the transparent conductive oxide layer of the substrate and subjected to heat treatment at 450° C. for 30 minutes to form a positive electrode having a platinum layer.

(3) An electrolyte according to Example 2 and Comparative Example 1 was deposited on the negative electrode to form a coating layer by screen printing. The liquid electrolyte of Comparative Example 2 was injected into the electrode through a hole of the electrode to form an electrolyte layer.

(4) With the prepared negative electrode and positive electrode disposed to face each other, an about 60 μm thick thermoplastic polymer layer comprising SURLYN (manufactured by Du Pont) was formed and placed in an oven at 130° C. for 2 minutes to attach and seal the two electrodes, thereby providing a dye-sensitive solar cell.

Testing for Photoelectric Conversion Efficiency of Dye-Sensitive Solar Cell

To estimate photoelectric conversion efficiency of dye-sensitive solar cells comprising the electrolytes prepared in Example 2 and Comparative Examples 1 and 2, photoelectric characteristics were observed by measuring photo-voltage and photo-current by the following method. In measurement, a Xenon lamp (manufactured by Oriel) was used as a light source and the operating condition (AM 1.5) of the Xenon lamp was calibrated based on a reference solar cell. Based on photocurrent ($I_{sc}$), photovoltage ($V_{oc}$) and fill factor (ff) obtained, photoelectric conversion efficiency ($\eta_e$) was calculated by the following equation:

$$\eta_e = (V_{oc} \times I_{sc} \times ff)/(P_{ine}),$$

wherein ($P_{ine}$) is 100 mW/cm² (1 sun).

The measured values are provided in Table 1.

TABLE 1

| Electrolyte | Current Density (mA) | Voltage (V) | Fill Factor | Photoelectric Conversion Efficiency (%) |
|---|---|---|---|---|
| Example 2 | 14.229 | 0.839 | 0.687 | 8.211 |
| Comparative Example 1 | 13.311 | 0.833 | 0.705 | 7.825 |
| Comparative Example 2 | 13.114 | 0.819 | 0.709 | 7.628 |

As apparent from Table 1, it could be seen that dye-sensitive solar cells comprising the coating layer formed of nanogel electrolyte of Example 2 showed higher current density and enhanced photoelectric conversion efficiency as compared with dye-sensitive solar cells comprising general nano silica nanogel (Comparative Example 1) and liquid electrolyte (Comparative Example 2).

What is claimed is:

1. A nanogel electrolyte for dye-sensitive solar cells comprising: a nanoparticle to which an imidazolium salt represented by Formula 1 is chemically bound; and an ionic liquid electrolyte:

<Formula 1>

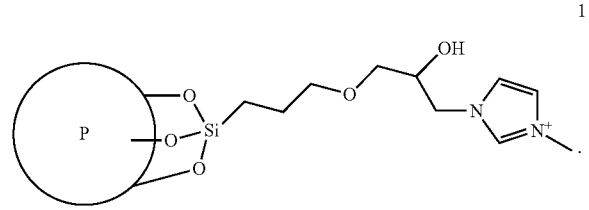

wherein P is a nanoparticle.

2. The nanogel electrolyte of claim 1, wherein the nanoparticle is nano silica ($SiO_2$), nano titanium dioxide ($TiO_2$), or nano tin dioxide ($SnO_2$).

3. The nanogel electrolyte of claim 1, wherein the nanoparticle is nano silica ($SiO_2$).

4. The nanogel electrolyte of claim 1, wherein the ionic liquid electrolyte comprises an ionic liquid and an oxidation-reduction derivative.

5. The nanogel electrolyte of claim 4, wherein the ionic liquid is prepared by mixing at least one compound selected from the group consisting of n-methylimidazolium iodide, n-ethylimidazolium iodide, ethyl-methyl imidazolium iodide, 1-benzyl-2-methyl imidazolium iodide, 1-ethyl-3-methyl imidazolium iodide, 1-butyl-3-methylimidazolium iodide, methylpyridinium iodide, ethylpyridinium iodide, propylpyridinium iodide, methylethylpyridinium iodide, dimethylpyridinium iodide, ethylmethylimidazolium dicyanamide, and guanidium thiocyanate.

6. The nanogel electrolyte of claim 4, wherein the oxidation-reduction derivative is selected from the group consisting of lithium iodide, sodium iodide, potassium iodide, lithium bromide, sodium bromide, potassium bromide, a quaternary ammonium salt, an imidazolium salt, and a pyridinium salt.

* * * * *

UNITED STATES PATENT AND TRADEMARK OFFICE
CERTIFICATE OF CORRECTION

PATENT NO. : 8,808,565 B2
APPLICATION NO. : 13/553125
DATED : August 19, 2014
INVENTOR(S) : Han et al.

It is certified that error appears in the above-identified patent and that said Letters Patent is hereby corrected as shown below:

In the Claims

Claim 1, Column 7, Lines 6-18 (Formula 1):

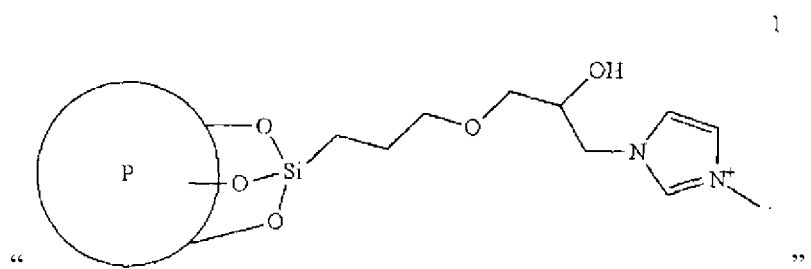

"                                                                     "

should be

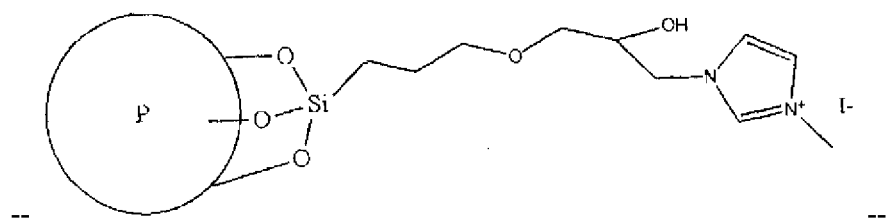

--                                                                     --

Signed and Sealed this
Twenty-first Day of July, 2015

Michelle K. Lee
*Director of the United States Patent and Trademark Office*